United States Patent
Yeh

(10) Patent No.: US 8,146,038 B2
(45) Date of Patent: Mar. 27, 2012

(54) METHOD FOR CONJECTURING EFFECTIVE WIDTH AND EFFECTIVE LENGTH OF GATE

(75) Inventor: Kuo-Liang Yeh, Hsinchu (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 359 days.

(21) Appl. No.: 12/509,496

(22) Filed: Jul. 27, 2009

(65) Prior Publication Data

US 2011/0022997 A1     Jan. 27, 2011

(51) Int. Cl.
*G06F 17/50*     (2006.01)

(52) U.S. Cl. ........................................ 716/111

(58) Field of Classification Search .................. 716/106, 716/111, 112, 113, 115
See application file for complete search history.

(56) References Cited

U.S. PATENT DOCUMENTS

| | | | |
|---|---|---|---|
| 6,514,778 B2 | 2/2003 | Huang et al. | |
| 2006/0131670 A1* | 6/2006 | Ogura et al. | 257/406 |
| 2007/0161194 A1 | 7/2007 | Jang | |
| 2008/0203500 A1* | 8/2008 | Ogura et al. | 257/411 |

* cited by examiner

*Primary Examiner* — Vuthe Siek
(74) *Attorney, Agent, or Firm* — Winston Hsu; Scott Margo

(57) ABSTRACT

A method for conjecturing the effective size, i.e. the effective width or effective length, of a gate is disclosed. First, a first design gate group including a first gate design width and a first gate design length is provided. Second, an intrinsic gate channel capacitance and an edge capacitance of the first design gate are respectively obtained by calculation. Then a size error, i.e. a width error or a length error is predicted by means of the intrinsic gate channel capacitance and of the edge capacitance to calculate a calculated inversion capacitance and a predicted size deviation. Later, the size error is repeatedly predicted to minimize the predicted size deviation and to optimize the size error to obtain an optimized size error. Afterwards, the effective size of the gate are conjectured by means of the optimized size error.

20 Claims, 2 Drawing Sheets

METHOD FOR CONJECTURING EFFECTIVE WIDTH AND EFFECTIVE LENGTH OF GATE

BACKGROUND OF THE INVENTION

1. Field of the Invention

The present invention relates to a method for conjecturing the effective width and effective length of a gate. In particular, the present invention relates to a method for conjecturing the effective width and effective length of a gate using an optimal width error and length error and determining an intrinsic gate channel capacitance and an edge capacitance of a design gate by calculation.

2. Description of the Prior Art

MOSFET is an important semiconductor element, usually made from the standard semiconductor process. When the standard semiconductor process is used, every part of the semiconductor element, such as a source, a drain and a gate, is gradually formed in accordance with a pre-determined specification. The effective gate width ($W_{eff}$) as well as the effective gate length ($L_{eff}$) which are highly associated with the electrical properties of the MOSFET need checking carefully because the effective gate width and the effective gate length have profound influence on the element performance and the development of the process.

Although each part of the semiconductor element, such as the gate, is gradually formed in accordance with a pre-determined specification, however, due to the process variation, the gate size, or the effective gate width and the effective gate length to say, is not quiet the same as the expected specification. Strictly speaking, the electrical properties' highly-associated effective gate width and effective gate length are more crucial than the physical gate width and physical gate length because they influence on the element performance and the development of the process much more profoundly.

The current method used to determine the gate width and the gate length is by TEM. However, this is not a flawless way to do it. In one aspect, the results are not reliable due to the limited sampling and checked by naked eyes. In another aspect, the results can merely reflect the physical width and the physical length of the gate. It none the less reveals nothing about the effective gate width and the effective gate length which are practically associated with the electrical properties.

It is a shame that there is no current and useful way to determine an effective width and an effective length of a gate. Accordingly, to obtain a way to determine an effective width and an effective length of a gate is critical in this field.

SUMMARY OF THE INVENTION

The present invention therefore proposes a method for conjecturing an effective size, i.e. an effective width and an effective length of a design gate. An effective size, i.e. an effective width and an effective length of a design gate can be conjectured through optimal width error and optimal length error evaluation after an intrinsic gate channel capacitance and an edge capacitance are obtained by calculation. In one embodiment of the present invention, the design gate includes multiple different gate design widths or lengths, so a conjectured group width error or a conjectured group length error which is applied for all the gate design width and the gate design length may be obtained when a group width error or a group length error is conjectured. Such conjectured group width error or conjectured group length error is also helpful in determining an effective width or an effective length of an unknown design gate.

A method for conjecturing an effective width and an effective length of a design gate is also proposed. First, a design gate group is provided. The design gate group includes a gate design size, such as a gate design width and a gate design length. Second, an intrinsic gate channel capacitance of the design gate is obtained by calculation through measuring a measured inversion capacitance of the design gate group under an inversion voltage. Later, an edge capacitance of the design gate group is obtained by calculation through measuring a zero capacitance of the design gate group under a zero gate voltage. Then a width error is predicted by means of the intrinsic gate channel capacitance and the edge capacitance to calculate a width calculated inversion capacitance and a predicted width deviation. Afterwards, the width error is repeatedly predicted to minimize the predicted width deviation and to optimize the predicted width error so as to obtain an optimized width error. Alternatively, a length error is predicted by means of the intrinsic gate channel capacitance and the edge capacitance to calculate a length calculated inversion capacitance and a predicted length deviation. Afterwards, the length error is repeatedly predicted to minimize the predicted length deviation and to optimize the predicted width error so as to obtain an optimized predicted length error. Thereafter, the effective width and the effective length of the gate are conjectured by means of the optimized predicted width error and the optimized predicted length error.

In one embodiment of the present invention, the design gate group includes multiple different gate design widths or multiple different gate design length. To conjecture a group width error or a group length error may also obtain a conjectured group width error or a conjectured group length error applied for all the gate design width and the gate design length. In another embodiment of the present invention, such conjectured group width error or conjectured group length error is also helpful in determining an effective width or an effective length of an unknown design gate.

These and other objectives of the present invention will no doubt become obvious to those of ordinary skill in the art after reading the following detailed description of the preferred embodiment that is illustrated in the various figures and drawings.

DETAILED DESCRIPTION

The method of the present invention for conjecturing an effective width and an effective length of a design gate is useful in determining the unknown effective width and unknown effective length of the design gate from a physical width and a physical length of the gate. If the design gate includes multiple different gate design widths or multiple different gate design lengths, a conjectured group width error or a conjectured group length error may be obtained to be applied for all the gate design width and all the gate design length. On the other hand, such conjectured group width error or conjectured group length error is also helpful in determining an effective width or an effective length of an unknown design gate.

Figure 1A:
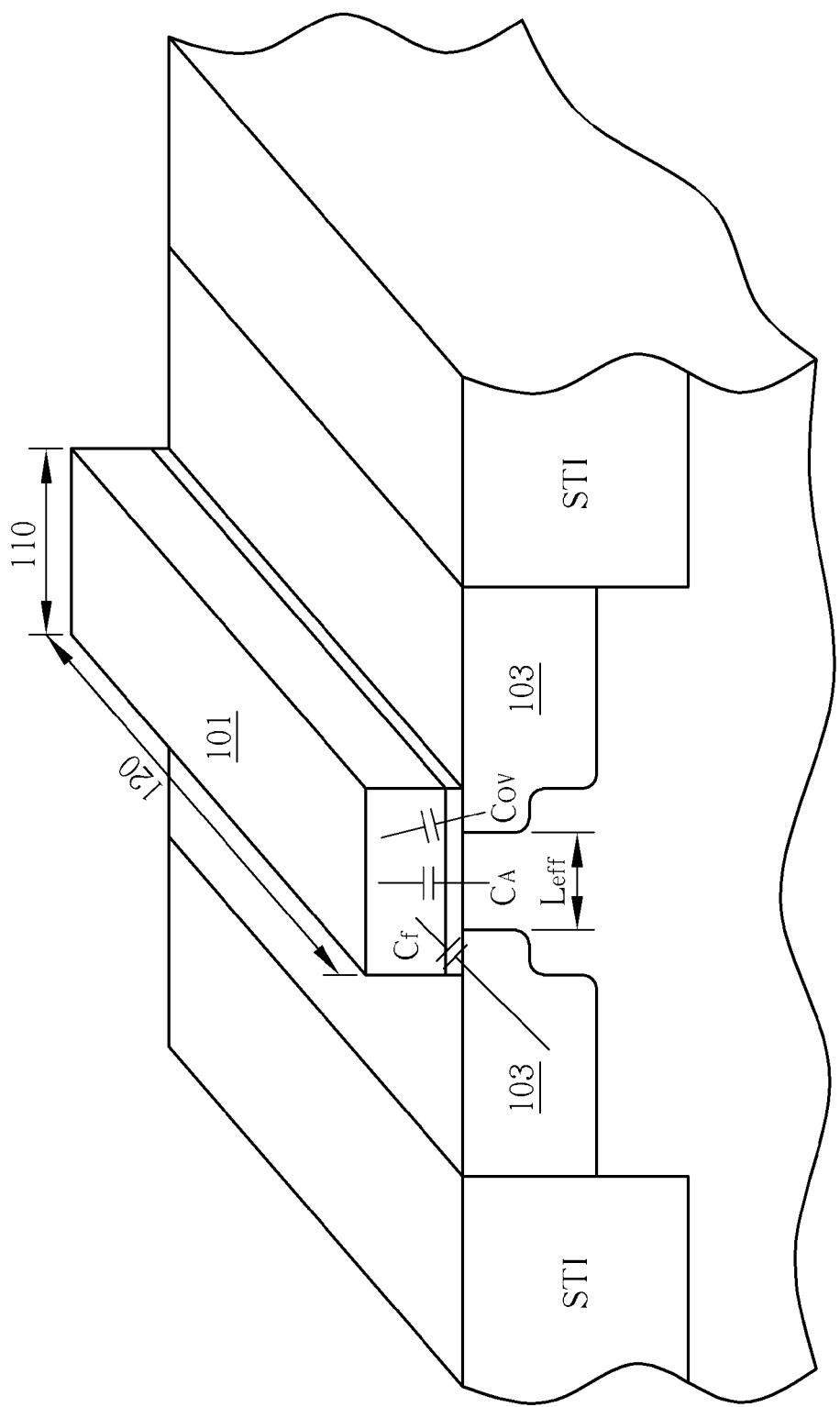
FIGS. 1A and 1B illustrate the method for conjecturing an effective width and an effective length of a design gate of the present invention.
Figure 1B:
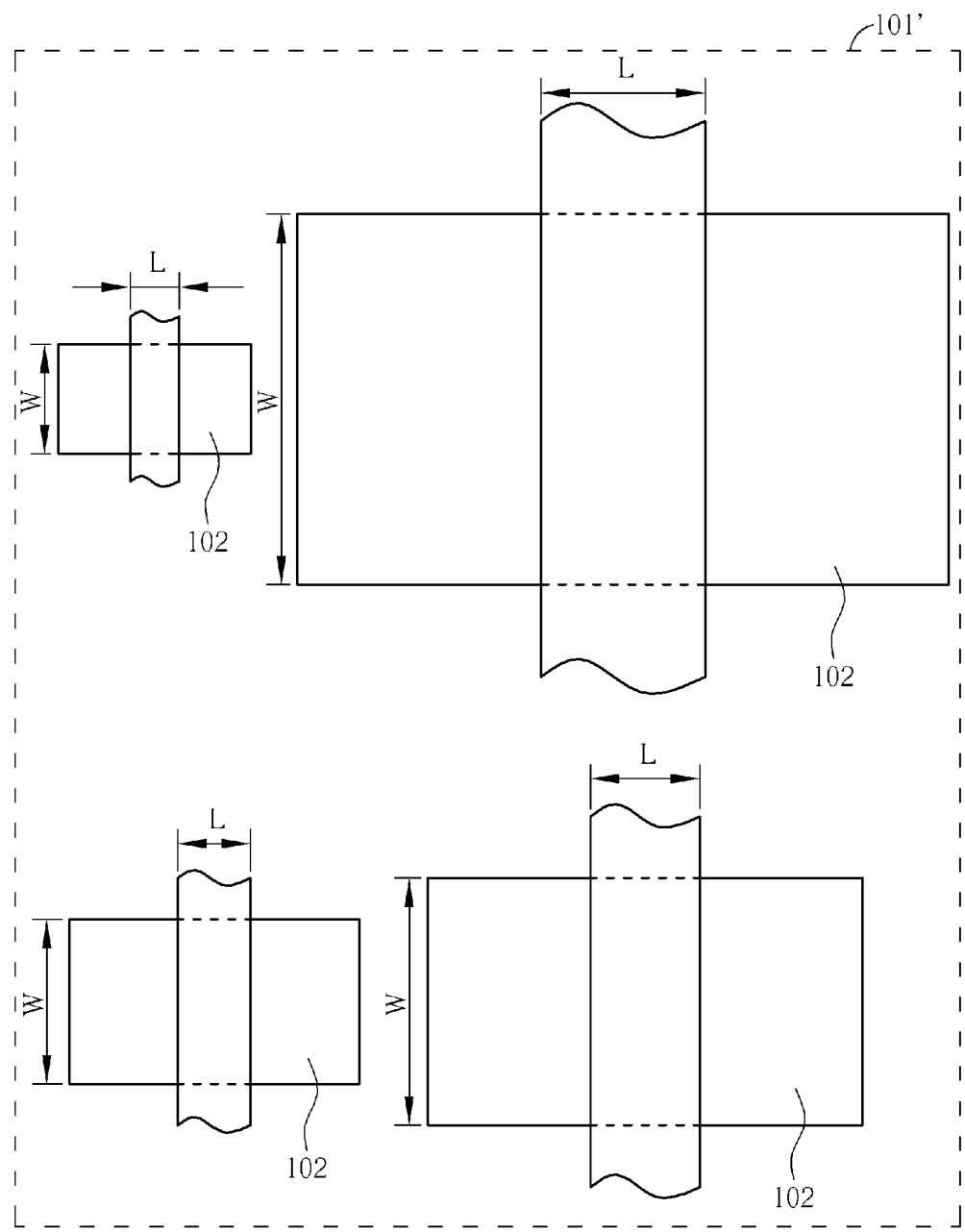

FIGS. 1A and 1B illustrate the method for conjecturing an effective width and an effective length of a design gate of the present invention. For a design gate 101, it has a specific design length 110 ($L_{des}$) and a design width 120 ($W_{des}$). The design length 110 and the design width 120 are ideal dimensions which come from simulations by calculations in order to meet some specific requirements, but variations as well as errors of the process are not taken into consideration. As described earlier, the effective gate width and the effective gate length which are highly associated with the electrical properties are not quite similar due to the semiconductor process. The effective gate width ($W_{eff}$) and the effective gate length ($L_{eff}$) are expressed by the following equation:

$$C_{inv}=L_{eff}*W_{eff}*C_A*N+2*C_{edge}*W_{eff}*N$$

$C_{inv}$=inversion capacitance
$C_A$=gate channel capacitance
$C_{edge}$=edge capacitance
N=number of gate If the number of gate is known, the effective width and the effective length of the design gate can be conjectured once the inversion capacitance, the gate channel capacitance, and the edge capacitance are obtained.

First, as shown in FIG. 1A, a first design gate 101 is provided. The first design gate 101 includes a first gate design length 110 and a first gate design width 120 but the effective gate width and the effective gate length are unknown. In another embodiment of the present invention, a design gate group 101' including multiple different design gates 102, as shown in FIG. 1B. So, the design gate group 101' includes multiple different gate design widths ($W_{des}$) and multiple different gate design lengths ($L_{des}$).

Second, when the design size, i.e. the design width and the design length, are large enough, the differences between the design size, i.e. the design width and the design length, and the effective size, i.e. the effective width and the effective length, are too small to be practical. Besides, the gate to the source 103 capacitance ($C_f$), the gate to the drain 103 capacitance ($C_f$) and the gate to the lightly doped drain 103 (LDD) capacitance ($C_f$), which are related to the product of multiplication of the edge capacitance ($C_{edge}=C_f+C_{ov}$) and the effective gate width ($W_{eff}$), i.e. $C_{edge}*W_{eff}$, may be ignored with respect to the product of multiplication of $C_A*L_{eff}*W_{eff}$ under an inversion voltage when the design width and the design length are large enough. Accordingly, the measured inversion capacitance ($C_{minv}$) of the first design gate 101 under the inversion voltage is measured to calculate the gate channel capacitance ($C_A$) of the first design gate 101.

$$W_{eff} \approx W_{des}$$

$$L_{eff} \approx L_{des}$$

$$2*C_{edge}*W_{eff}*N << L_{eff}*W_{eff}*C_A*N$$

$$C_{minv}=L_{eff}*W_{eff}*C_A*N$$

$$C_A=(C_{minv})/(L_{des}*W_{des}*N)$$

EXAMPLE $W_{des}$=9 µm $L_{des}$=9 µm

N=1

$C_{minv}$=1.377E+03 fF $C_A$=1.70E+01(fF/µm²)

Further, when the gate voltage is zero ($V_g$=0, depletion mode), there is no gate channel capacitance ($C_A$). Still, when the design size of the gate is large enough, the differences between the design size and the effective size may be ignored. Accordingly, the zero capacitance ($C_{vg}$) at zero gate voltage of the first design gate 101 can be measured to calculate the edge capacitance ($C_{edge}$) of the first design gate.

$$W_{eff} \approx W_{des}$$

$$L_{eff} \approx L_{des}$$

$$L_{eff}*W_{eff}*C_A*N \approx 0$$

$$C_{vg}=2*C_{edge}*W_{des}*N$$

$$C_{edge}=C_{vg}/(2*W_{des}*N)$$

EXAMPLE $W_{des}$=9 µm $L_{des}$=0.036 µm

N=1

$C_{vg}$=4.41 fF $C_{edge}$=2.45E-01 (fF/µm)

Next, after the $C_{inv}$ is actually measured and the $C_{edge}$ as well as the $C_A$ are calculated, now it is ready to conjecture the effective width and the effective length of the gate. Because in practice, there should be a difference between the $W_{des}$ and the $W_{eff}$, a width error ($\Delta W$) is introduced to link the $W_{des}$ and the $W_{eff}$. For the first design gate 101, $$W_{eff}=W_{des}+\Delta W$$

Similarly, a length error ($\Delta L$) is introduced to link the $L_{des}$ and the $L_{eff}$ $$L_{eff}=L_{des}+\Delta L$$

Then, the effective width will be conjectured in accordance with the previously obtained $C_{edge}$ and the $C_A$. As a matter of convenience, the $L_{eff}$ is represented by the $L_{des}$ for the time being, i.e. $\Delta L$=0. For instance, the $\Delta W$ is set to be $\Delta W_1$ at will to obtain a first width measured inversion capacitance ($C_{cwinv1}$) and a predicted first width deviation ($E_{W1}$).

$$C_{cwinv1}=L_{des}*(W_{des}+\Delta W_1)*C_A*N+2*C_{edge}*(W_{des}+\Delta W_1)*N$$

Now define the size deviation (E) to be:

$$E=(C_{cwinv}/C_{minv})-1$$

Accordingly, the first width deviation is:

$$E_{W1}=(C_{cwinv1}/C_{minv})-1=\{[L_{des}*(W_{des}+\Delta W_1)*C_A*N+2*C_{edge}*(W_{des}+\Delta W_1)*N]/C_{minv}\}-1$$

wherein, all $L_{des}$, $W_{des}$, $\Delta W_1$, $C_A$, N, $C_{edge}$ and $C_{minv}$ are known.

For the next step, the $E_{W1}$ will be minimized as much as possible. In other words, the $E_{W1}$ will be optimized so that the first $C_{cwinv}$ is as close to the first $C_{minv}$ as possible. The operation procedure may be, for example, many different $\Delta W$, for instance $\Delta W_1$, $\Delta W_2$, $\Delta W_3$ ... $\Delta W_n$, are used to repeatedly calculate the $E_{W1}$ so that there must be an optimal $\Delta W_{ox}$ which makes the $E_{W1}$ as close to zero as possible. Accordingly, the optimal $\Delta W_{ox}$ is considered to be the optimal first width error in the first stage.

In another aspect, similar steps may be taken to conjecture the first length error ($\Delta L_1$). For example, the $\Delta L$ is set to be $\Delta L_1$ at will to obtain a first length measured inversion capacitance ($C_{clinv1}$) and a predicted first length deviation ($E_{L1}$). Again, as a matter of convenience, the $W_{eff}$ is represented by the $W_{des}$ for the time being, i.e. $\Delta W=0$.

$$L_{eff}=L_{des}+\Delta L$$

$$C_{clinv1}=(L_{des}+\Delta L)*W_{des}*C_A*N+2*C_{edge}*W_{des}*N$$

$$E_{L1}=(C_{clinv1}/C_{minv})-1=\{[(L_{des}+\Delta L)*W_{des}*C_A*N+2*C_{edge}*W_{des}*N]/C_{minv}\}-1$$

Also, the $E_{L1}$ is expected to be minimized as much as possible. In other words, the $E_{L1}$ will be optimized so that the first $C_{1winv}$ is as close to the first $C_{minv}$ as possible. Many different $\Delta L$, for instance $\Delta L_1, \Delta L_2, \Delta L_3 \ldots \Delta L_n$, may be used to repeatedly calculate the $E_{L1}$ so that there must be an optimal $\Delta L_{ox}$ which makes the $E_{L1}$ as close to zero as possible. Accordingly, the optimal $\Delta L_{ox}$ is considered to be the optimal first length error in the first stage.

After the optimal first width error ($\Delta W_{ox}$) and the optimal first length error ($\Delta L_{ox}$) are obtained in the first stage, the optimal first width error ($\Delta W_{ox}$) may be used to facilitate the conjecture of the length error ($\Delta L$) or alternatively, the optimal first length error ($\Delta L_{ox}$) may be used to facilitate the conjecture of the width error ($\Delta W$) as well. For example, to predict again the $\Delta L$ to be $\Delta L_1$ at will, the previously obtained optimal first width error ($\Delta W_{ox}$) now is involved in a current $W_{eff}$, that is:

$$W_{eff}=W_{des}+\Delta W_{ox}$$

Or, to predict again the $\Delta W$ to be $\Delta W_1$ at will, the previously obtained optimal first length error ($\Delta L_{ox}$) now is involved in a current $L_{eff}$, that is:

$$L_{eff}=L_{des}+\Delta L_{ox}$$

In one aspect, the gate channel capacitance ($C_A$) is independent of the change of the length error ($\Delta L$) and the width error ($\Delta W$). In another aspect, the edge capacitance ($C_{edge}$) is independent of the change of the length error ($\Delta L$) and the width error ($\Delta W$), too, so the gate channel capacitance ($C_A$) and the edge capacitance ($C_{edge}$) are excluded from the conjecture of the width error ($\Delta W$) and the length error ($\Delta L$).

In such a way, the optimal first width error ($\Delta W_{ox}$) is used to facilitate the conjecture of the length error ($\Delta L$) and the optimal first length error ($\Delta L_{ox}$) is used to facilitate the conjecture of the width error ($\Delta W$) and after repeated operations, an effective width and an effective length of the gate are finally conjectured and an optimal width error ($\Delta W_o$) and an optimal length error ($\Delta L_o$) at last are obtained if the size deviation, i.e. the $E_W$ and the $E_L$, converges to an acceptable range, 1% or 0.1% for example.

In one embodiment of the present invention, the design gate group 101' includes multiple different design gates 102, a shown in FIG. 1B. The different design gates 102 may have different gate design widths ($W_{des}$) or gate design lengths ($L_{des}$). In the method of conjecturing an effective gate width and an effective gate length of the present invention, it is expected to find a group width error ($\Delta W_G$) to describe multiple different gate design widths ($W_{des}$) of the same gate design length ($L_{des}$), preferably, to describe all the different gate design widths ($W_{des}$) in the design gate group 101' of the same gate design length ($L_{des}$). Similarly, the present invention also expects to find a group length error ($\Delta L_G$) to describe multiple different gate design lengths ($L_{des}$) of the same gate design width ($W_{des}$), preferably, to describe all the different gate design lengths ($L_{des}$) in the design gate group 101' of the same gate design width ($W_{des}$).

For example, there are three different gate design lengths ($L_{des}$), namely $L_{des}\alpha$, $L_{des}\beta$ and $L_{des}\gamma$, in the multiple different design gates 102. The group length error ($\Delta L_G$) is set to be a first group length error ($\Delta L_{G1}$) at will to respectively obtain a first group length measured inversion capacitance ($C_{clginv1}$) and a predicted first group length deviation ($E_{LG1}$). Again, as a matter of convenience, the $W_{eff}$ is represented by the $W_{des}$ for the time being, i.e. $\Delta W=0$.

$$L_{eff}\alpha=L_{des}\alpha+\Delta L_{G1}$$

$$L_{eff}\beta=L_{des}\beta+\Delta L_{G1}$$

$$L_{eff}\gamma=L_{des}\gamma+\Delta L_{G1}$$

$$C_{c\alpha lginv1}=(L_{des}\alpha+\Delta L_{G1})*W_{des}\alpha*C_A*N+2*C_{edge}*W_{des}\alpha*N$$

$$E_{LG\alpha1}=(C_{c\alpha linv1}/C_{minv})-1$$

Later, try to find a first group length error ($\Delta L_{G1}$) which makes all three $E_{LG\alpha1}$, $E_{LG\beta1}$ and $E_{LG\gamma1}$ minimal, for example the minimal for all three $E_{LG\alpha1}$, $E_{LG\beta1}$ and $E_{LG\gamma1}$. The first group length error ($\Delta L_{G1}$) is then considered to be an optimal first group length error ($\Delta L_{Go1}$). Similarly, with respect to the group width error ($\Delta W_G$), a first group width measured inversion capacitance ($C_{cwginv1}$) and a predicted first group width deviation ($E_{WG1}$) are calculated to further find the optimal first group width error ($\Delta W_{Go1}$).

As described earlier, after the optimal first group length error ($\Delta L_{Go1}$) and the optimal first group width error ($\Delta W_{Go1}$) are obtained in the last stage, the optimal first group width error ($\Delta W_{Go1}$) may be used to facilitate the conjecture of the group length error ($\Delta L_G$) or alternatively, the optimal first group length error ($\Delta L_{Go1}$) may be used to facilitate the conjecture of the group width error ($\Delta W_G$) as well. In such a way, the optimal group width error ($\Delta W_{Go}$) is used to facilitate the conjecture of the group length error ($\Delta L_G$) and the optimal group length error ($\Delta L_{Go}$) is used to facilitate the conjecture of the group width error ($\Delta W_G$), and after repeated operations, an effective width and an effective length of the gate are finally conjectured and an optimal group width error ($\Delta W_{Go}$) and an optimal group length error ($\Delta L_{Go}$) at last are obtained if the size deviation, i.e. the width deviation and the length deviation, converges to an acceptable range, 1% or 0.1% for example.

EXAMPLE $L_{des}$=0.036 µm $W_{des}$=9, 0.45, 0.108 µm $\Delta L_{Go}$=-0.0094 µm group length deviation ($E_{LG1}$)

| % | 9 $W_{des}$ | 0.45 $W_{des}$ | 0.108 $W_{des}$ | $E_{LG1}$ square root |
|---|---|---|---|---|
| 0.036 $L_{des}$ | -0.10% $E_{LG}$ | 2.76% $E_{LG}$ | -2.67% $E_{LG}$ | 2.22% |

Because the previously obtained optimal group width error ($\Delta W_{Go}$) or the optimal group length error ($\Delta L_{Go}$) is optimal to multiple, preferably, all of the different sizes, width or length for example, of the design gates 102 in the design gate group 101', moreover, the previously obtained optimal group width error ($\Delta W_{Go}$) or the optimal group length error ($\Delta L_{Go}$) may be regarded as optimal to all the size range of the different design gates 102.

In still another embodiment of the present invention, a size formula regarding the width or the length can be found. Such size formula may substantially describe the dimensional information, such as the relationship between the size and the optimal group size error of the multiple design gates 102 of different sizes. In such a way, the size formula may make conjecture an effective size, such as an effective width or an effective length of an unknown given gate possible.

For example, there are three different gate design widths, 9, 0.45, 0.108 to say, in the multiple design gates 102 of different sizes. The corresponding optimal group width errors with respect to the different gate design widths, that is (9, −0.05), (0.45, −0.0133), (0.108, 0.0035) can be found after the above-mentioned steps. Through the data, a formula which simultaneously satisfies three of these data pairs is found. If more than one formula can be found, the formula which has the smallest power of an unknown number is preferred. For example, $$\Delta W = -0.0052W - 0.0033$$

Please refer to the above-described procedures for the idea for operating different gate design length. For example, a formula:

$$\Delta L = 0.001L2 - 0.0084L - 0.0108$$

may describe the data pairs (9, −0.0026), (0.9, −0.0174), (0.1, −0.0135), (0.036, −0.0094).

Still in another embodiment of the present invention, if a design gate of known gate design length or known gate design width is given with a certain range, the effective width or the effective length of any given gate can be accordingly conjectured.

For example, if a certain design gate has a gate design length between 9 and 0.108, the previously obtained formula can be used by interpolation to determine the effective gate length corresponding to the physical gate design length of this design gate. Similarly, the same idea also applies in determining the effective gate width corresponding to the physical gate design width of this design gate.

Those skilled in the art will readily observe that numerous modifications and alterations of the device and method may be made while retaining the teachings of the invention.

What is claimed is:

1. A method for conjecturing an effective width and an effective length of a gate by using a computer, comprising:
    providing a first design gate group comprising a first gate design width and a first gate length;
    measuring a first measured inversion capacitance of said first design gate group under an inversion voltage to calculate an intrinsic gate channel capacitance of said first design gate group;
    measuring a zero capacitance of said first design gate group under a zero gate voltage to calculate an edge capacitance of said first design gate group;
    predicting a first width error by means of said intrinsic gate channel capacitance and of said edge capacitance to calculate a calculated inversion capacitance of a first width and a predicted first width deviation;
    repeatedly predicting said first width error to minimize said predicted first width deviation and to optimize the first width error to obtain an optimized first width error;
    predicting a first length error by means of said intrinsic gate channel capacitance and of said edge capacitance to calculate a calculated inversion capacitance of a first length and a predicted first length deviation;
    repeatedly predicting said first length error to minimize said predicted first length deviation and to optimize the first length error to obtain an optimized first length error; and
    conjecturing said effective width and said effective length of said first design gate group by means of said optimized first width error and said optimized first length error.

2. The method of claim 1, wherein said intrinsic gate channel capacitance is irrelevant to a change of said first width error and said first length error.

3. The method of claim 1, wherein said edge capacitance is irrelevant to a change of said first width error and said first length error.

4. The method of claim 1, wherein said edge capacitance is associated with a lightly doped drain capacitance and with a source/drain capacitance.

5. The method of claim 1, wherein one of said first width error and said first length error is conjectured to be 0 to facilitate conjecturing the other.

6. The method of claim 1, wherein one of said optimized first width error and said optimized first length error is used to facilitate conjecturing the other.

7. The method of claim 1, wherein said first design gate group comprises multiple different gate design widths.

8. The method of claim 7, further comprising:
    predicting a group width error by means of said intrinsic gate channel capacitance and of said edge capacitance to calculate a group width calculated inversion capacitance and a predicted group width deviation; and
    repeatedly predicting said group width error to minimize said predicted group width deviation of said multiple different gate design widths and to optimize said group width error to obtain an optimized group width error.

9. The method of claim 8, wherein said optimized group width error is used to facilitate conjecturing a group length error.

10. The method of claim 8, wherein a square root is used to determine the minimization of said predicted group width error value of said multiple different gate design widths.

11. The method of claim 8, further comprising:
    providing a width formula which is capable of substantially describing a relationship between said multiple different gate design widths and an optimization of said group width error to make conjecture a gate effective width of a given design gate possible.

12. The method of claim 11, wherein an interpolation is used to conjecture said gate effective width of said given gate by means of said width formula and a gate size of said given design gate.

13. The method of claim 11, wherein said width formula has the smallest power of an unknown number.

14. The method of claim 1, wherein said first design gate group comprises multiple different gate design lengths.

15. The method of claim 14, further comprising:
    predicting a group length error by means of said intrinsic gate channel capacitance and of said edge capacitance to calculate a group length calculated inversion capacitance and a predicted group length deviation; and
    repeatedly predicting said group length error to minimize said predicted group length deviation of said multiple different gate design lengths and to optimize said group length error to obtain an optimized group length error.

16. The method of claim 15, wherein said optimized group length error is used to facilitate conjecturing a group width error.

17. The method of claim 15, wherein a square root is used to determine the minimization of said predicted group length error value of said multiple different gate design lengths.

18. The method of claim 15, further comprising:
providing a length formula which is capable of substantially describing a relationship between said multiple different gate design lengths and an optimization of said group length error to make conjecture a gate effective length of a given design gate possible.

19. The method of claim 18, wherein an interpolation is used to conjecture said gate effective length of said given gate by means of said length formula and a gate size of said given design gate.

20. The method of claim 18, wherein said length formula has the smallest power of an unknown number.

\* \* \* \* \*